(12) United States Patent
Wang

(10) Patent No.: US 8,824,237 B2
(45) Date of Patent: Sep. 2, 2014

(54) PRE-DECODER FOR DUAL POWER MEMORY

(71) Applicant: MediaTek Inc., Hsin-Chu (TW)

(72) Inventor: Chia-Wei Wang, Taichung (TW)

(73) Assignee: Mediatek Inc., Hsin-Chu (TW)

( * ) Notice: Subject to any disclaimer, the term of this patent is extended or adjusted under 35 U.S.C. 154(b) by 27 days.

(21) Appl. No.: 13/835,908

(22) Filed: Mar. 15, 2013

(65) Prior Publication Data

US 2013/0286763 A1   Oct. 31, 2013

Related U.S. Application Data

(60) Provisional application No. 61/638,233, filed on Apr. 25, 2012.

(51) Int. Cl.
G11C 8/00 (2006.01)
G11C 8/10 (2006.01)

(52) U.S. Cl.
CPC .......................... *G11C 8/10* (2013.01)
USPC ...................... 365/230.06; 365/226

(58) Field of Classification Search
USPC ............................. 365/230.06, 226
See application file for complete search history.

(56) References Cited

U.S. PATENT DOCUMENTS

| | | | |
|---|---|---|---|
| 6,021,087 A * | 2/2000 | Bosshart | 365/230.06 |
| 6,490,222 B2 | 12/2002 | Choi et al. | |
| 6,646,949 B1 | 11/2003 | Ellis et al. | |
| 6,813,216 B2 | 11/2004 | Lee | |
| 7,206,228 B2 * | 4/2007 | Park | 365/185.17 |
| 8,164,971 B2 | 4/2012 | Wang et al. | |
| 8,320,210 B2 * | 11/2012 | Narayanaswamy et al. | 365/210.1 |
| 2010/0302880 A1 | 12/2010 | Wang et al. | |

OTHER PUBLICATIONS

Chen, Y.H., et al.; "A 0.6V 45nm adaptive dual-rail SRAM compiler circuit design for lower VDD_min VLSIs;" Symposium on VLSI Circuits Digest of Technical Papers; 2008; pp. 210-211.

* cited by examiner

*Primary Examiner* — Michael Tran
(74) *Attorney, Agent, or Firm* — McClure, Qualey & Rodack, LLP

(57) ABSTRACT

A pre-decoder for providing a pulse signal to a dual power rail word line driver is provided. The pre-decoder includes a clock generator, an address latch and decoder, a level shifter and a processing unit. The clock generator generates a first signal according to a clock, wherein the first signal is powered by a first supply voltage. The address latch and decoder decodes an address to obtain a second signal according to the first signal. The level shifter generates a third signal according to the first signal, wherein the third signal is powered by a second supply voltage higher than the first supply voltage. The processing unit generates the pulse signal according to the second signal and the third signal, wherein the pulse signal is powered by the second supply voltage.

17 Claims, 9 Drawing Sheets

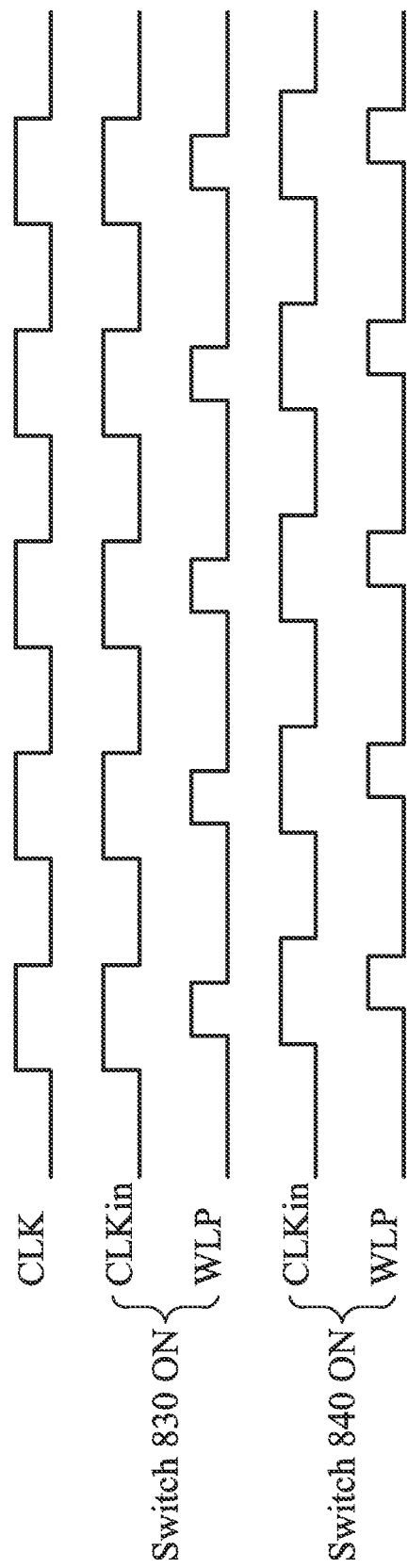

PRE-DECODER FOR DUAL POWER MEMORY

CROSS REFERENCE TO RELATED APPLICATIONS

This application claims the benefit of U.S. Provisional Application No. 61/638,233 filed Apr. 25, 2012, the entirety of which is incorporated by reference herein.

BACKGROUND OF THE INVENTION

1. Field of the Invention

The invention relates to a dual power memory, and more particularly to a pre-decoder of a dual power memory 2. Description of the Related Art Since process technologies have been scaled down, such as deep sub-micron process technologies, the layout area of a system on chip (SOC) has greatly been decreased. However, memory device reliability (e.g. static random access memory (SRAM)) for SOCs with greatly decreased sizes is poor due to low supply voltages, threshold voltage mismatch caused by process variations and so on. For example, a threshold voltage mismatch of a memory device is about 35 mV/sigma for the 65 nm process. Moreover, such threshold voltage mismatch of a memory device is hard to estimate or simulate by a SPICE corner model, such as an SS (slow PMOS, slow NMOS), TT (typical PMOS, typical NMOS), FF (fast PMOS, fast NMOS), SF, or FS model.

In general, a 10 Mbit memory or greater, is common in an SOC. If a memory device of the SOC is operated with low supply voltage, read/write failure occurs due to threshold voltage mismatch among the memory cells. Furthermore, defect density of read/write failure is increased when supply voltage is decreased.

FIG. 1 shows a schematic diagram of an SRAM 110, wherein the SRAM 110 is implemented in an integrated circuit 100. The integrated circuit 100 further comprises a random logic 120 which is powered by a supply voltage VDD. The SRAM 110 comprises a memory array 111 with a plurality of memory cells, a level shifter 112, a word line (WL) decoder 113 for decoding the address signals to obtain the predecode signals, a control unit 114 for controlling the read/write operations, and an input/output (I/O) unit 115 for receiving and transmitting data between the SRAM 110 and the random logic 120. Note that there could be an address, clock, and read/write control signals running between the control unit 114 and the random logic 120. In order to avoid read/write failure for the SRAM 110, the memory array 111 is powered by a supply voltage CVDD which is higher than the supply voltage VDD. The level shifter 112 is disposed between the word line decoder 113 and the memory array 111, which is used to change the voltage levels of signals generated by the word line decoder 113 from the supply voltage VDD level to the supply voltage CVDD level, so as to drive the memory array 111.

FIG. 2 shows a word line driver array 200 with a plurality of dual power rail drivers, wherein the word line driver array 200 is coupled between a word line decoder 202 powered by the supply voltage VDD and a memory array 204 powered by the supply voltage CVDD. The word line decoder 202 provides a pulse signal XPC indicating that one section of the SRAM corresponding to the address signals has been selected. The word line decoder 202 further provides a plurality of predecode signals (ex. predecode[0], predecode[1], predecode[2] etc.) to the word line driver array 200 according to the address signals ADD. Each dual power rail driver of the word line driver array 200 generates a word line signal according to the corresponding predecode signal and the pulse signal XPC. For example, when the pulse signal XPC is asserted, the driver 210 generates a word line signal WL[0] according to the predecode signal predecode[0], the driver 220 generates a word line signal WL[1] according to the predecode signal predecode[1], the driver 230 generates a word line signal WL[2] according to the predecode signal predecode[2] and so on. In the word line driver array 200, each word line driver has a level shifter, such as a level shifter 212 of the driver 210, a level shifter 222 of the driver 220 or a level shifter 232 of the driver 230, wherein each level shifter is disposed in data transmission path. Therefore, layout area and extra gate-delay in the critical timing path are increased, thus slowing access of the memory array.

FIG. 3 shows another word line driver array 300 with a plurality of dual power rail drivers, wherein the word line driver array 300 is coupled between a word line decoder 302 powered by the supply voltage VDD and a memory array 304 powered by the supply voltage CVDD. Compared with the word line driver array 200 of FIG. 2, no level shifter exists in the data transmission path for each word line driver in the word line driver array 300, thereby the layout area of the word line driver array 300 is smaller than that of the word line driver array 200 of FIG. 2. However, a level shifter 306 disposed in the pulse signal transmission path is used to change the voltage levels of a pulse signal XPC generated by the word line decoder 302 from the supply voltage VDD level to the supply voltage CVDD level. Therefore, an extra gate-delay in the critical timing path is increased, thus slowing access of the memory array.

FIG. 4 shows a schematic diagram illustrating a conventional single power rail pre-decoder 400. The pre-decoder 400 can be implemented in the word line decoder 202 of FIG. 2. The pre-decoder 400 comprises an address latch and decoder 410, a clock generator 420, a NAND gate 430 and an inverter 440. The clock generator 420 generates a pulse signal WLP according to a clock CLK, and provides the pulse signal WLP to the address latch and decoder 410 and the NAND gate 430. The address latch and decoder 410 generates a decoded signal PRC according to an address ADD and the pulse signal WLP. The NAND gate 430 generates a signal XPCB according to the decoded signal PRC and the pulse signal WLP. The inverter 440 inverts the signal XPCB to obtain a signal XPC. The signal XPC is a pulse signal indicating that one section of a memory array corresponding to the address ADD has been selected.

FIG. 5 shows a waveform illustrating the ideal timing considerations of a memory array. A setup time T_setup is the minimum amount of time that the address ADD should be held steady before a rising edge of the clock CLK, so that the address ADD is reliably sampled by the clock CLK. An access time T_access is the time that it takes a memory array to deliver the data DO in response to the address ADD. Therefore, according to the setup time T_setup and the access time T_access, a minimum clock period T_clock is given by the following equation:

$$T\_clock = T\_setup + T\_access.$$

FIG. 6 shows a schematic diagram illustrating a conventional dual power rail pre-decoder 500. The pre-decoder 500 can be implemented in the word line decoder 302 of FIG. 3. Compared with the pre-decoder 400 of FIG. 4, the pre-decoder 500 further comprises a level shifter 510, wherein the level shifter 510 receives the signal XPC powered by the supply voltage VDD to provide a signal XPC_LS which is powered by the supply voltage CVDD. Therefore, an extra gate-delay T_level_shifter is increased for the access time T_access, thereby the clock period T_clock is also increased. The increased clock period T_clock is given by the following equation:

$$T\_clock = T\_setup + T\_access\_new$$
$$= T\_setup + T\_access + T\_level\_shifter.$$

Therefore, it is desired to insert a level shifter in a critical timing path without affecting the clock period T_clock.

BRIEF SUMMARY OF THE INVENTION

A memory device and a pre-decoder thereof are provided. An embodiment of a pre-decoder for providing a pulse signal to a dual power rail word line driver is provided. The pre-decoder comprises: a clock generator, generating a first signal according to a clock, wherein the first signal is powered by a first supply voltage; an address latch and decoder, decoding an address to obtain a second signal according to the first signal; a level shifter, generating a third signal according to the first signal, wherein the third signal is powered by a second supply voltage higher than the first supply voltage; and a processing unit, generating the pulse signal according to the second signal and the third signal, wherein the pulse signal is powered by the second supply voltage.

Furthermore, an embodiment of a memory device is provided. The memory device comprises: a memory array; a word line decoder, decoding an address to obtain a plurality of predecode signals; a plurality of dual power rail word line drivers, each driving a word line of the memory array according to the individual predecode signal; a common transistor, having a gate for receiving a pulse signal, a first terminal coupled to a ground and a second terminal coupled to the dual power rail word line drivers; and a pre-decoder, providing the pulse signal according to the address and a clock. The pre-decoder comprises: a clock generator, generating a first signal according to the clock, wherein the first signal is powered by a first supply voltage; an address latch and decoder, decoding the address to obtain a second signal according to the first signal; a level shifter, generating a third signal according to the first signal, wherein the third signal is powered by a second supply voltage higher than the first supply voltage; and a processing unit, generating the pulse signal according to the second signal and the third signal, wherein the pulse signal is powered by the second supply voltage.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein:

FIG. 10 shows a waveform diagram illustrating the signals of the clock generator of FIG. 9.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
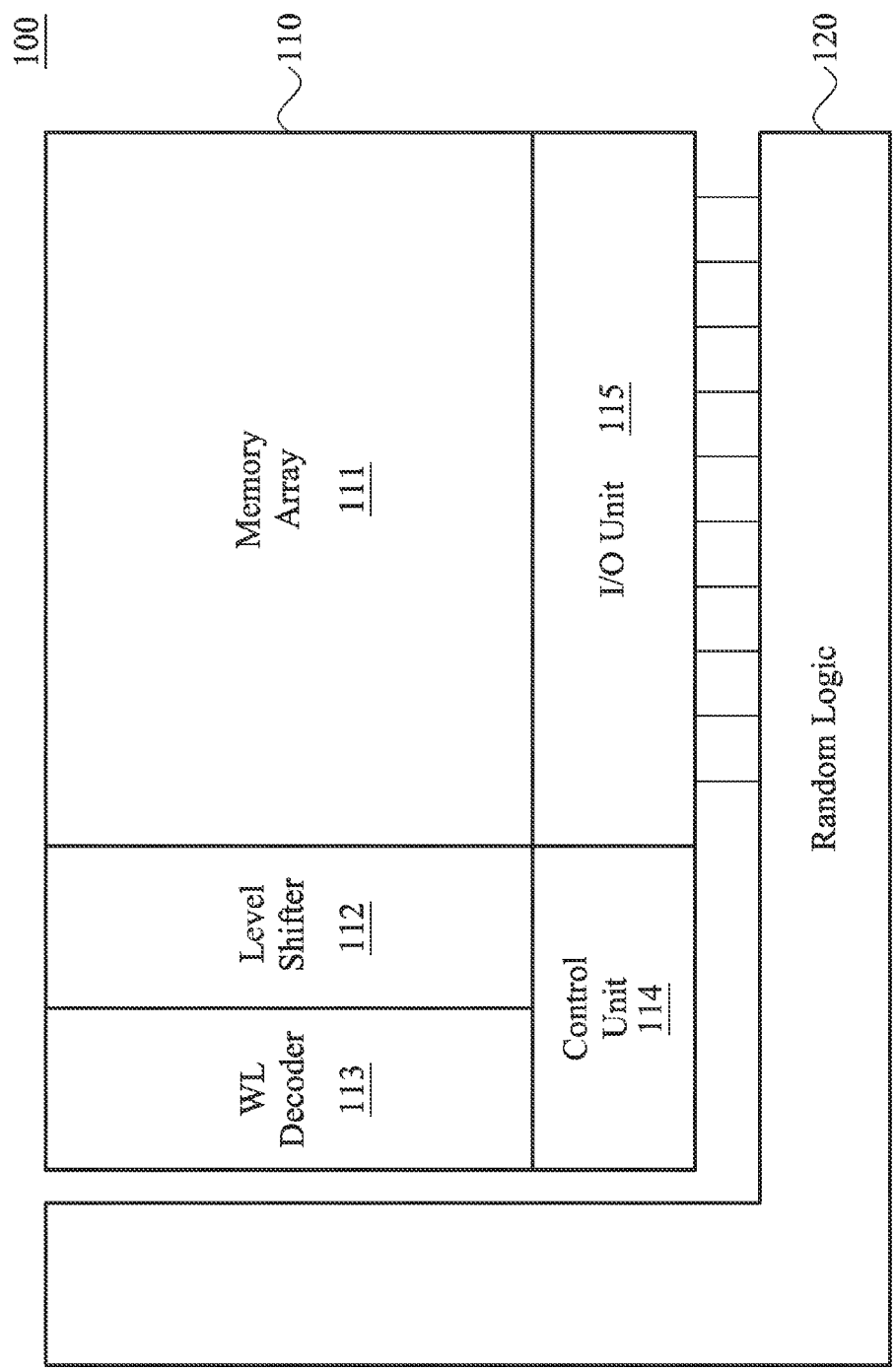
FIG. 1 shows a schematic diagram of an SRAM.
Figure 2:
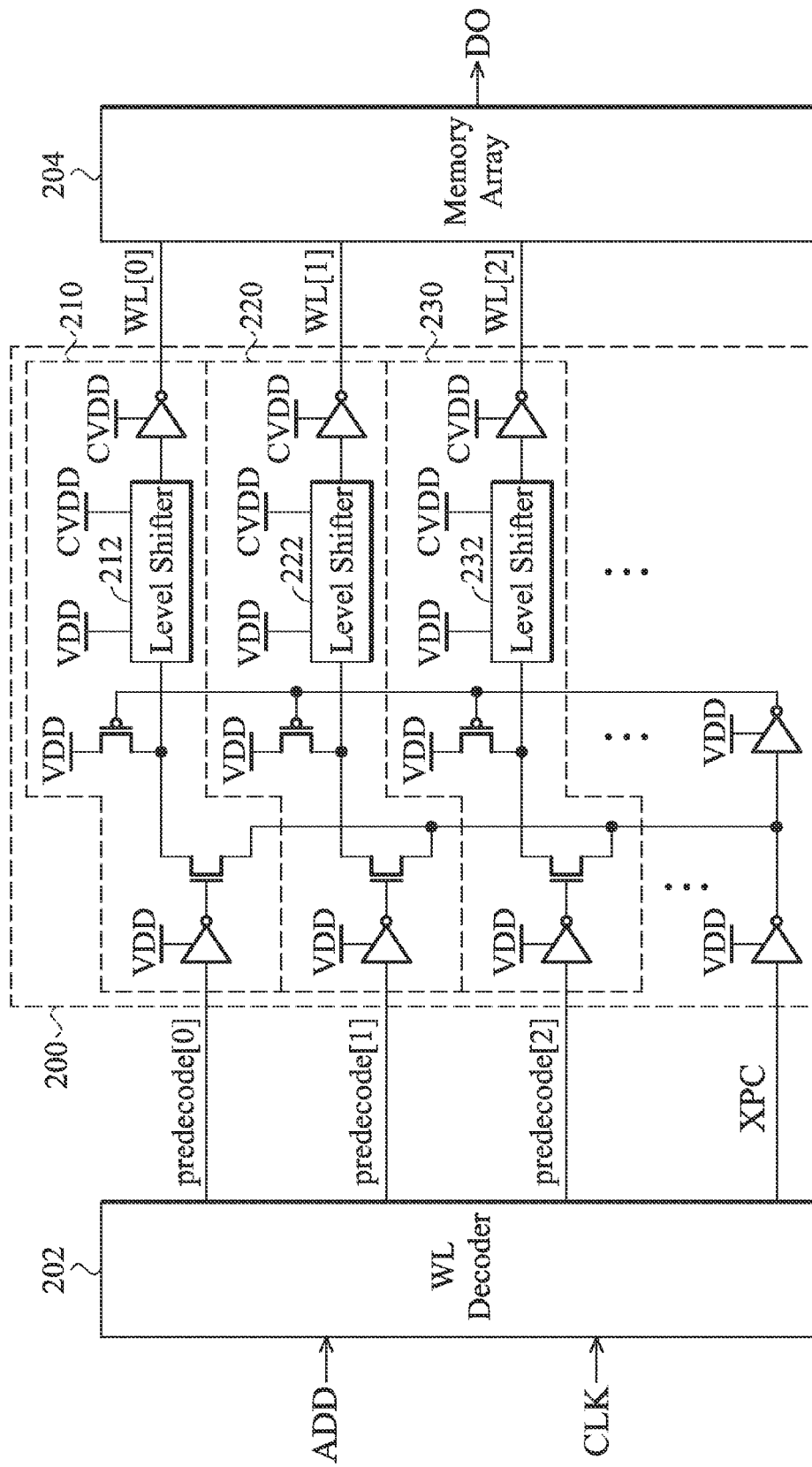
FIG. 2 shows a word line driver array with a plurality of dual power rail drivers.
Figure 3:
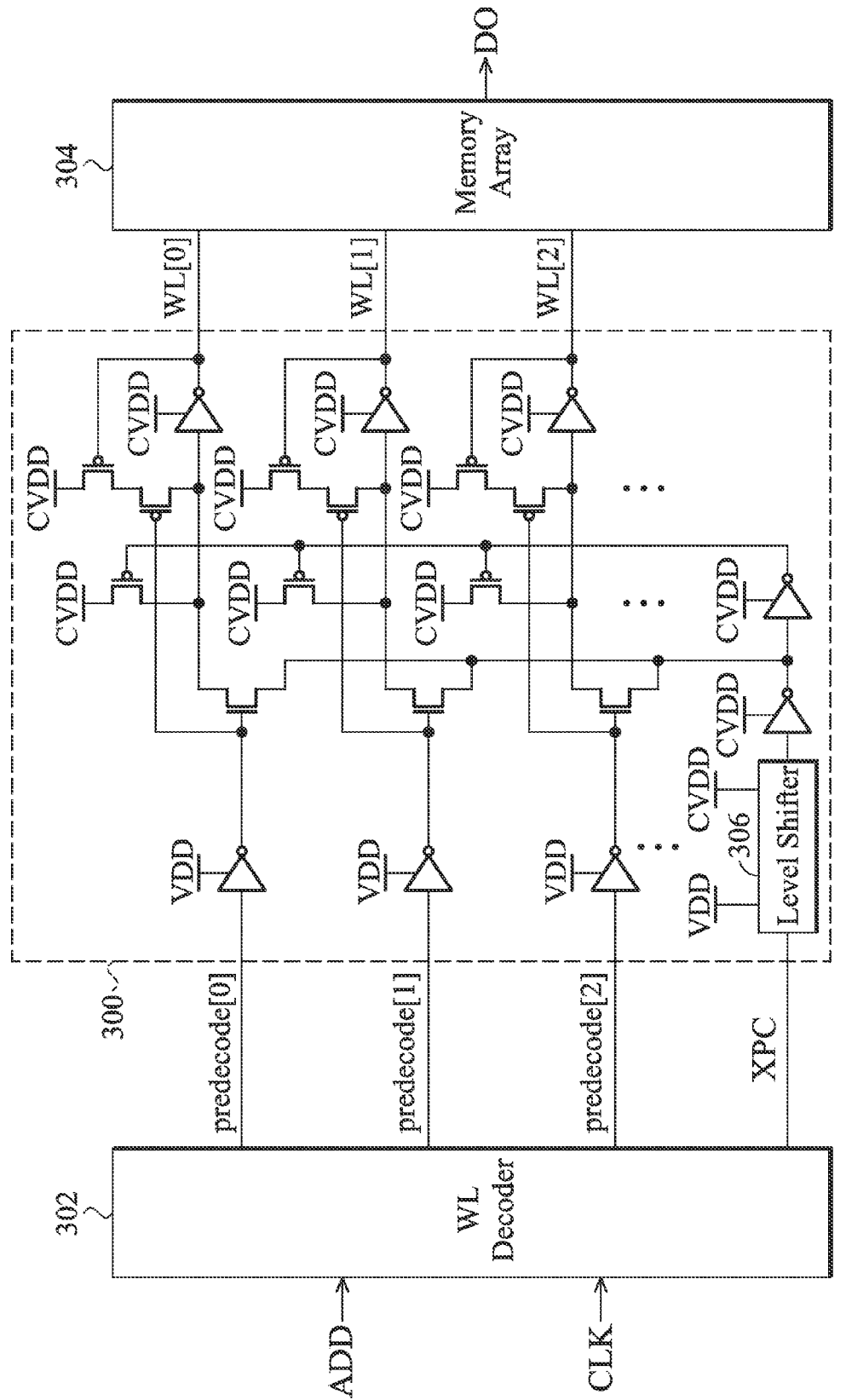
FIG. 3 shows another word line driver array with a plurality of dual power rail drivers.
Figure 4:
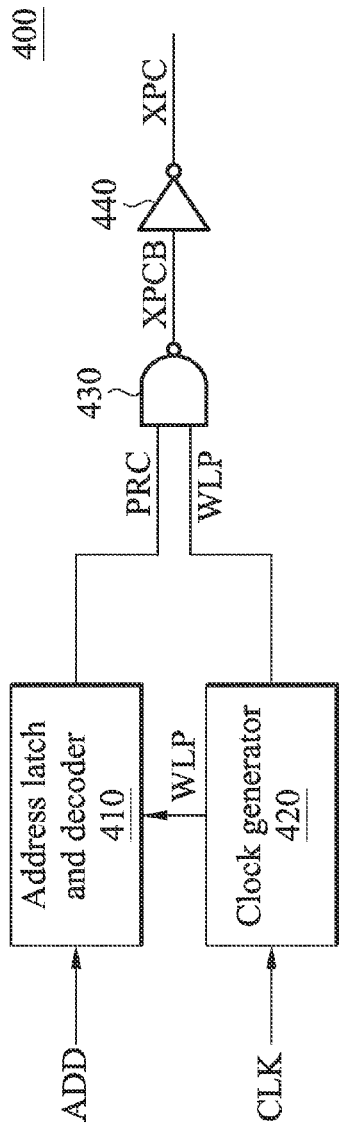
FIG. 4 shows a schematic diagram illustrating a conventional single power rail pre-decoder.
Figure 5:
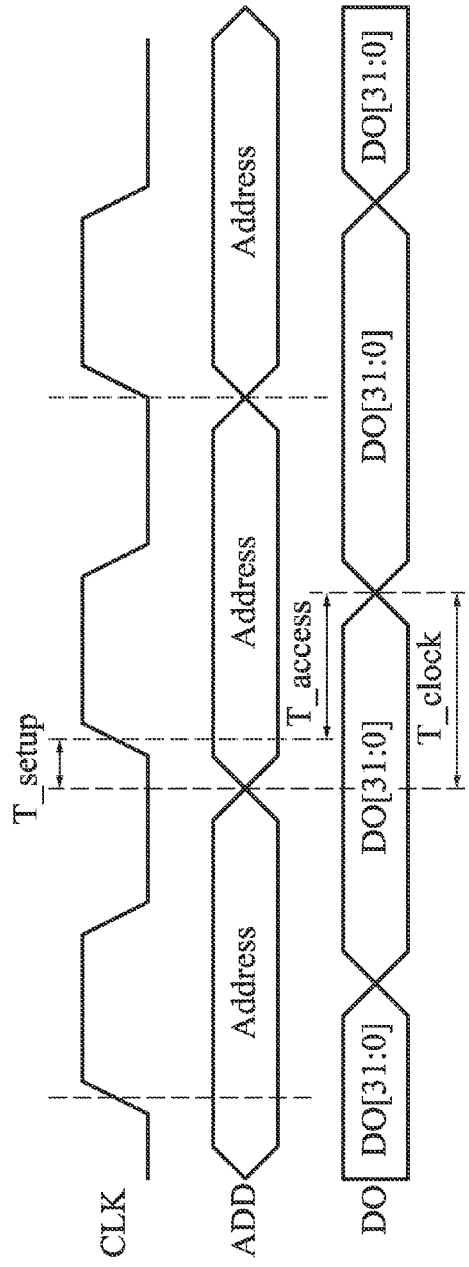
FIG. 5 shows a waveform illustrating the ideal timing considerations of a memory array.
Figure 6:
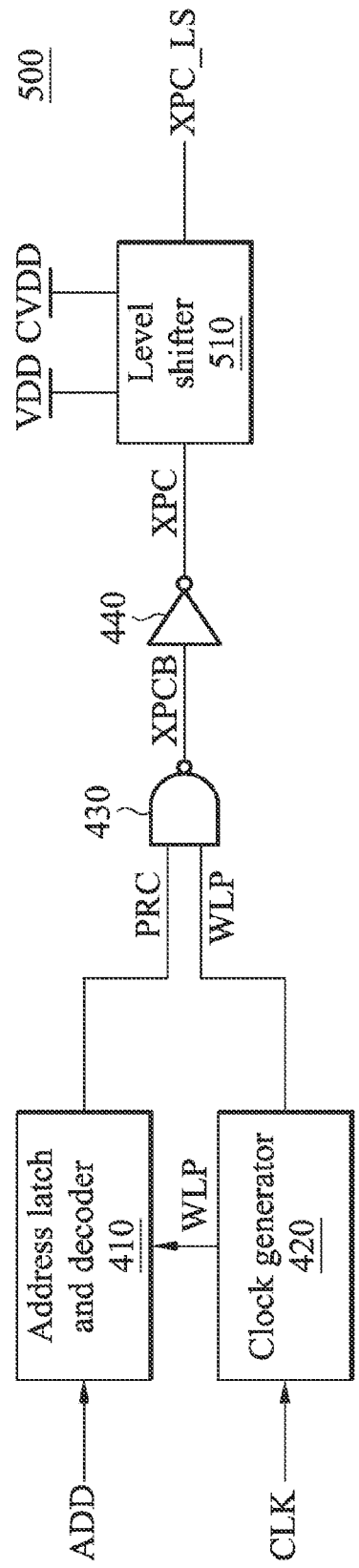
FIG. 6 shows a schematic diagram illustrating a conventional dual power rail pre-decoder.
Figure 7:
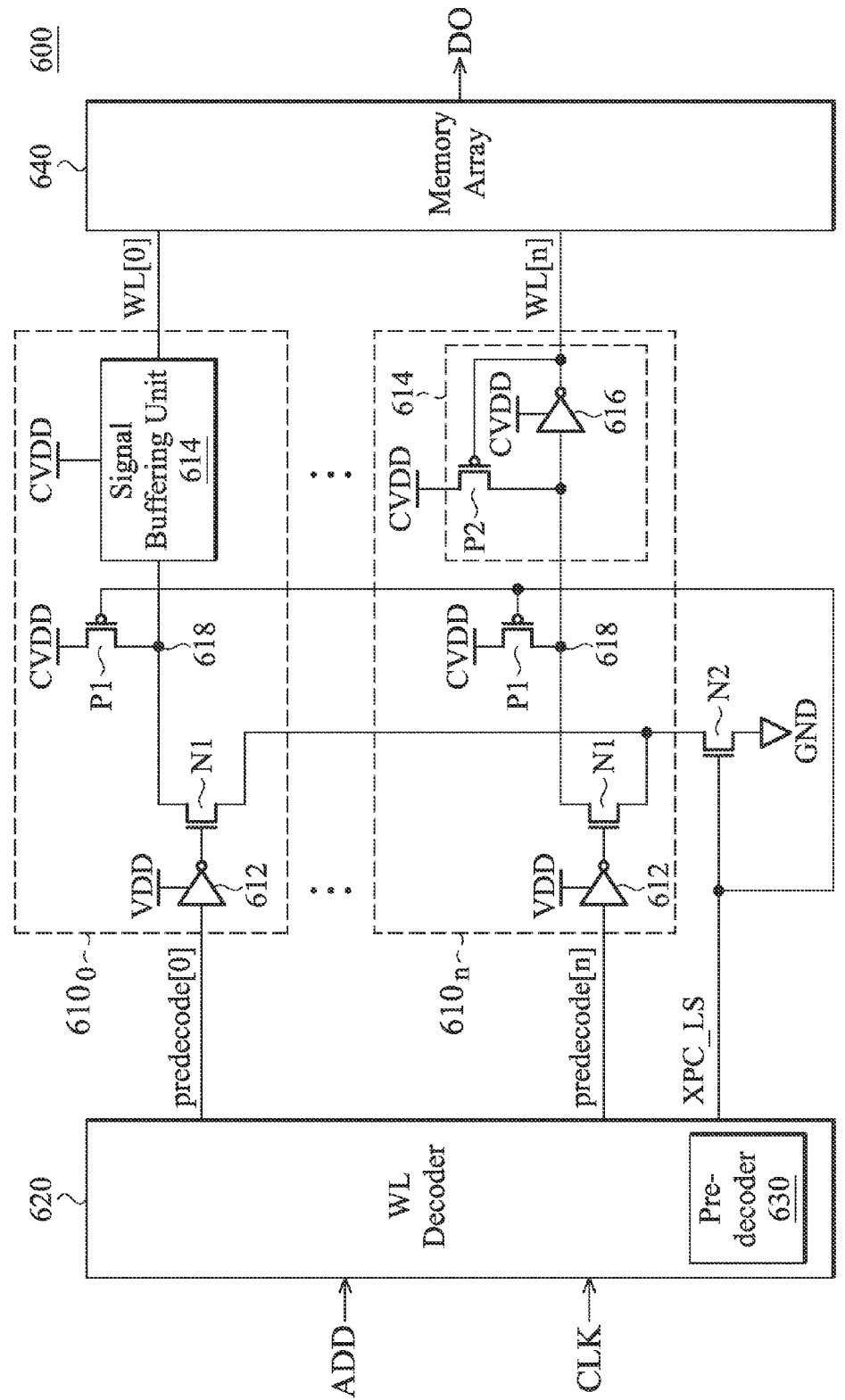
FIG. 7 shows a dual power memory device according to an embodiment of the invention.

FIG. 7 shows a dual power memory device 600 according to an embodiment of the invention. The memory device 600 is implemented in a system on chip (SOC). The memory device 600 comprises a plurality of dual power rail word line drivers $610_0$-$610_n$, a common NMOS transistor N2, a word line (WL) decoder 620 and a memory array 640, wherein the dual power rail word line drivers $610_0$-$610_n$ share the same NMOS transistor N2. According to the address ADD and clock CLK, the word line decoder 620 provides a plurality of predecode signals predecode[0]-predecode[n] to the dual power rail word line drivers $610_0$-$610_n$, respectively and the Word line decoder 620 may use a pre-decoder 630 to provide a pulse signal XPC_LS to a gate of the common NMOS transistor N2, wherein the predecode signals predecode[0]-predecode[n] are powered by a supply voltage VDD and the pulse signal XPC_LS is power by a supply voltage CVDD higher than the supply voltage VDD. Each of the dual power rail word line drivers $610_0$-$610_n$ receives an individual predecode signal from the word line decoder 620 and provides an individual word line signal to drive the corresponding word line of the memory array 640. Taking the dual power rail word line driver $610_0$ as an example, the dual power rail word line driver $610_0$ receives a predecode signal predecode[0] from the word line decoder 620 and provides a word line signal WL[0] to drive the corresponding word line of the memory array 640. Furthermore, each of the dual power rail word line drivers $610_0$-$610_n$ comprises an inverter 612, a signal buffering unit 614, an NMOS transistor N1 and a PMOS transistor P1. The signal buffering unit 614 is coupled between the corresponding word line and a node 618, wherein the signal buffering unit 614 comprises a PMOS transistor P2 and an inverter 616. The signal buffering unit 614 could be a latch, half latch, buffer, or any component capable of buffering or driving signal. The PMOS transistor P2 is coupled between the supply voltage CVDD and the node 618, and has a gate coupled to the corresponding word line. The inverter 420 is coupled between the corresponding word line and the node 618, which is powered by the supply voltage CVDD. In the embodiment, the signal buffering unit 614 is used as an example for description, and does not limit the invention. The PMOS transistor P1 is coupled between the supply voltage CVDD and the node 618, wherein the PMOS transistor P1 has a gate for receiving the pulse signal XPC_LS. The pulse signal XPC_LS is a global pulse signal for a word line decoding operation. Due to that the pulse signal WLP_LS being powered by the supply voltage CVDD, the PMOS transistor P1 can be completely turned off by the pulse signal XPC_LS. The NMOS transistor N1 is coupled between the node 618 and the common NMOS transistor N2, and has a gate coupled to the inverter 612. The inverter 612 receives the corresponding predecode signal from the Word line decoder 620 and controls the NMOS transistor N1 to turn on or off according to a signal opposite to the corresponding predecode signal, wherein the inverter 612 is powered by the supply voltage VDD. The common NMOS transistor N2 is coupled between the NMOS transistors N1 and a ground GND, and has a gate for receiving the pulse signal XPC_LS. In one embodiment, the pre-decoder 630 may be implemented in the other circuits on the outside of the word line decoder 620.

Figure 8:
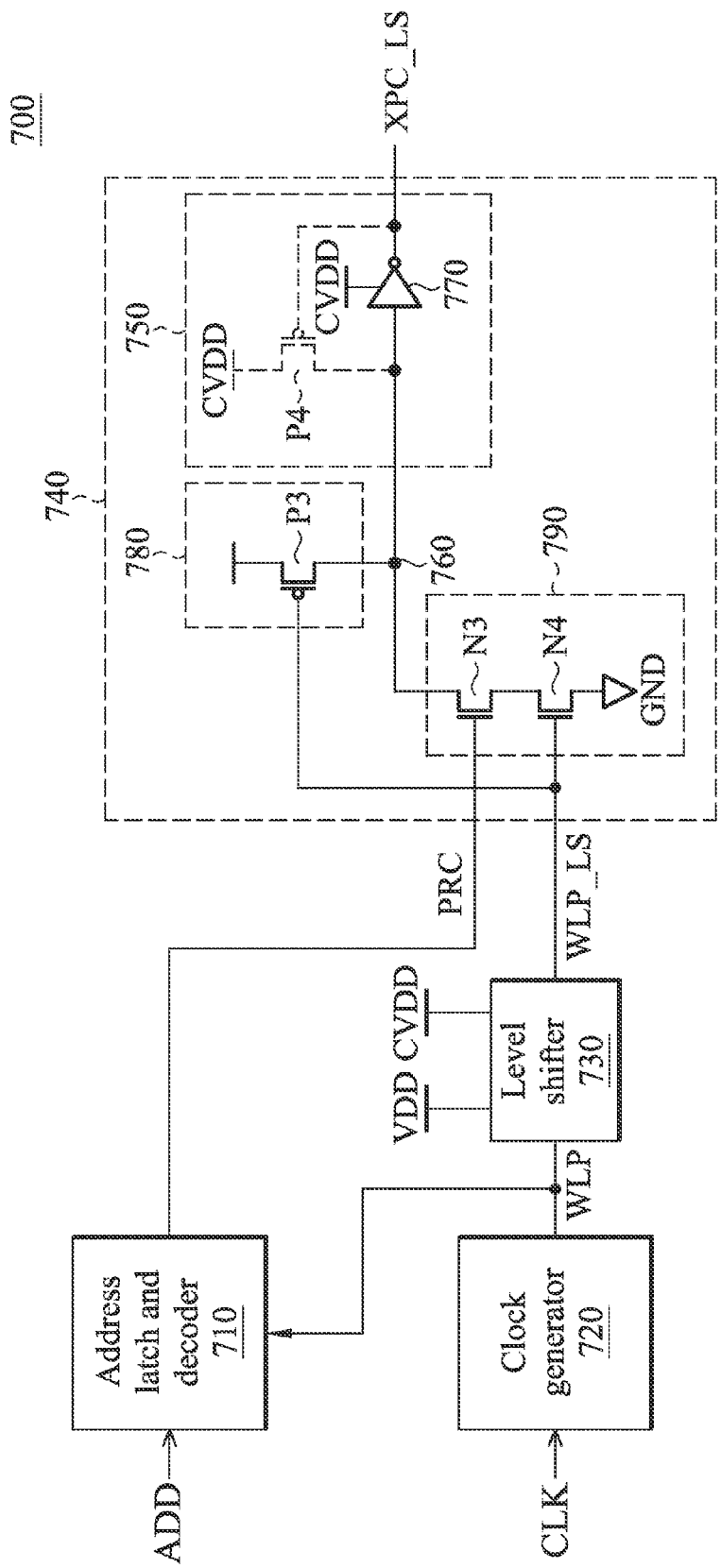
FIG. 8 shows a pre-decoder according to an embodiment of the invention.

FIG. 8 shows a pre-decoder 700 according to an embodiment of the invention. The pre-decoder 700 comprises an address latch and decoder 710, a clock generator 720, a level shifter 730 and a processing unit 740. The address latch and decoder 710 generates a decoded signal PRC according to an address ADD and a pulse signal WLP. The clock generator 720 generates the pulse signal WLP according to a clock CLK, and provides the pulse signal WLP to the address latch and decoder 710 and the level shifter 730. The level shifter 730 received the pulse signal WLP powered by the supply voltage VDD to provide a pulse signal WLP_LS powered by the supply voltage CVDD. The processing unit 740 comprises a signal buffering unit 750, a pull-up unit 780 and a pull-down unit 790, wherein the processing unit 740 generates the pulse signal XPC_LS according to the decoded signal PRC from the address latch and decoder 710 and the pulse signal WLP_LS from the level shifter 730. In the embodiment, the processing unit 740 functions as an AND logic. The signal buffering unit 750 is coupled between a node 760 and the gate of the common NMOS transistor N2 of FIG. 7. The signal buffering unit 750 comprises an inverter 770, wherein the inverter 770 is powered by the supply voltage CVDD. In one embodiment, the signal buffering unit 750 further comprises a PMOS transistor P4, wherein the PMOS transistor P4 is coupled between the supply voltage CVDD and the node 760 and has a gate coupled to an output of the inverter 770. The pull-up unit 780 comprises a PMOS transistor P3 coupled between the supply voltage CVDD and the node 760, wherein the PMOS transistor P3 has a gate for receiving the pulse signal WLP_LS. Due to that the pulse signal WLP_LS being powered by the supply voltage CVDD, the PMOS transistor P3 can be completely turned off by the pulse signal WLP_LS. The pull-down unit 790 is coupled between the node 760 and the ground GND, which comprises two NMOS transistor N3 and N4 connected in series. The NMOS transistor N3 is coupled between the node 760 and the NMOS transistor N4, and has a gate for receiving the decoded signal PRC from the address latch and decoder 710. The NMOS transistor N4 is coupled between the NMOS transistor N3 and the ground GND, and has a gate for receiving the pulse signal WLP_LS. In this embodiment, the level shifter 730 is disposed on a critical timing path, thus decreasing a setup time T_setup and increasing an access time T_access. Therefore, a minimum clock period T_clock is obtained without timing impact, as shown in the following equation:

$$T\_clock = T\_setup\_new + T\_access\_new$$
$$= (T\_setup - T\_level\_shifter) + (T\_access + T\_level\_shifter)$$
$$= T\_setup + T\_access.$$

Figure 9:
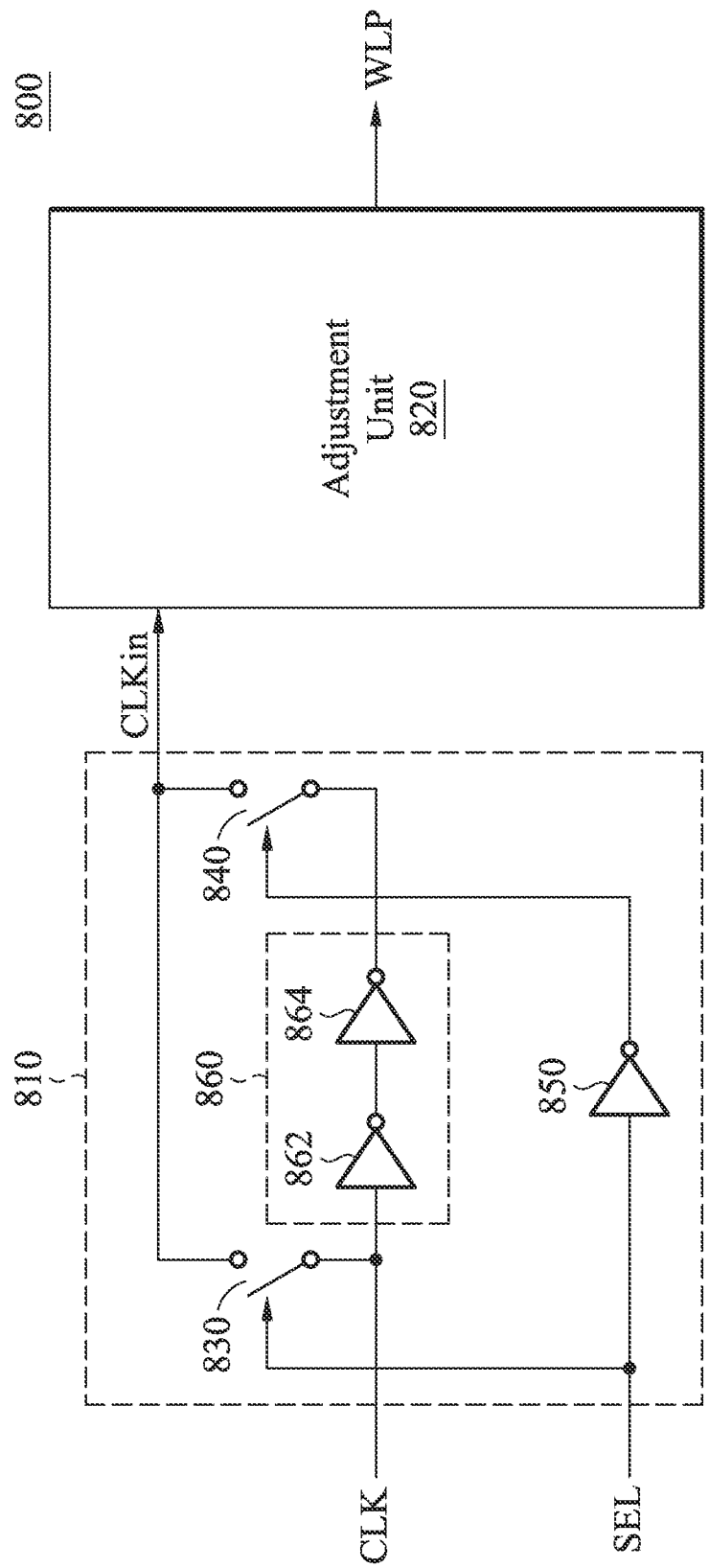
FIG. 9 shows a clock generator according to an embodiment of the invention.

FIG. 9 shows a clock generator 800 according to an embodiment of the invention. The clock generator 800 may provide a variable pulse signal WLP to the level shifter 730 and the address latch and decoder 710 of FIG. 8, to finely tune the access time T_access and the setup time T_setup. The clock generator 800 comprises a control unit 810 for delaying timing of the pulse signal WLP and an adjustment unit 820 for adjusting a duty cycle of the pulse signal WLP. The control unit 810 comprises two switches 830 and 840, a delay unit 860 and an inverter 850. The switch 830 is controlled by a select signal SEL, and the switch 840 is controlled by a select signal SELB complementary to the select signal SEL. Therefore, the switch 830 is turned on when the switch 840 is turned off, and switch 830 is turned off when the switch 840 is turned on. The inverter 850 generates the select signal SELB according to the select signal SEL. The delay unit 860 is coupled between the switch 830 and the switch 840, wherein the delay unit 860 comprises two inverters 862 and 864 connected in series. In one embodiment, the delay unit 860 may be a level shifter, a delay cell or a buffer cell. Furthermore, the adjustment unit 820 receives an internal clock signal CLKin provided by the control unit 810 to generate a pulse signal WLP, wherein the pulse signal WLP and the clock signal CLKin may have differential duty cycles. FIG. 10 shows a waveform diagram illustrating the signals of the clock generator 800 of FIG. 9. Referring to FIG. 9 and FIG. 10 together, if the switch 830 is turned on and the switch 840 is turned off, the clock CLK may directly serve as the internal clock signal CLKin, and the adjustment unit 820 may provide the pulse signal WLP according to the internal clock signal CLKin, wherein the pulse signal WLP has a duty cycle appropriate for memory access. If the switch 840 is turned on and the switch 830 is turned off, the clock CLK may be delayed to obtain the internal clock signal CLKin, and the adjustment unit 820 may provide the pulse signal WLP according to the delayed internal clock signal CLKin. Similarly, the pulse signal WLP corresponding to the delayed internal clock signal CLKin has a duty cycle appropriate for memory access.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A pre-decoder for providing a pulse signal to a dual power rail word line driver, comprising:
    a clock generator, generating a first signal according to a clock, wherein the first signal is powered by a first supply voltage;
    an address latch and decoder, decoding an address to obtain a second signal according to the first signal;
    a level shifter, generating a third signal according to the first signal, wherein the third signal is powered by a second supply voltage higher than the first supply voltage; and
    a processing unit, generating the pulse signal according to the second signal and the third signal, wherein the pulse signal is powered by the second supply voltage.

2. The pre-decoder as claimed in claim 1, wherein the processing unit comprises:
    a signal buffering unit coupled between the dual power rail word line driver and a node;
    a pull-down unit coupled between the node and a ground, wherein the pull-down unit is controlled by the second signal and the third signal; and a pull-up unit coupled between the node and the second supply voltage, wherein the pull-up unit is controlled by the third signal, wherein the signal buffering unit provides the pulse signal to the dual power rail word line driver when the pull-up unit is turned off by the third signal and the pull-down unit is turned on by the second signal and the third signal.

3. The pre-decoder as claimed in claim 2, wherein the pull-down unit comprises:
 a first transistor coupled to the node, wherein the first transistor is controlled by the second signal; and
 a second transistor coupled between the first transistor and the ground, having a gate for receiving the third signal; and
the pull-up unit comprises:
 a third transistor coupled between the node and the second supply voltage, having a gate for receiving the third signal.

4. The pre-decoder as claimed in claim 2, wherein the signal buffering unit comprises:
 an inverter coupled between the node and the dual power rail word line driver, wherein the inverter is powered by the second supply voltage.

5. The pre-decoder as claimed in claim 4, wherein the signal buffering unit further comprises:
 a fourth transistor coupled between the second supply voltage and the node, having a gate coupled to an output of the inverter.

6. The pre-decoder as claimed in claim 1, wherein the dual power rail word line driver drives a word line of a memory array, and the level shifter is used to increase an access time and decrease a setup time for the memory array.

7. The pre-decoder as claimed in claim 6, wherein the clock generator further selectively delays the first signal according to a select signal, so as to finely tune the access time and the setup time.

8. A memory device, comprising:
 a memory array;
 a word line decoder, decoding an address to obtain a plurality of predecode signals;
 a plurality of dual power rail word line drivers, each driving a word line of the memory array according to the individual predecode signal;
 a common transistor, having a gate for receiving a pulse signal, a first terminal coupled to a ground and a second terminal coupled to the dual power rail word line drivers; and
 a pre-decoder, providing the pulse signal according to the address and a clock, wherein the pre-decoder comprises:
  a clock generator, generating a first signal according to the clock, wherein the first signal is powered by a first supply voltage;
  an address latch and decoder, decoding the address to obtain a second signal according to the first signal;
  a level shifter, generating a third signal according to the first signal, wherein the third signal is powered by a second supply voltage higher than the first supply voltage; and
  a processing unit, generating the pulse signal according to the second signal and the third signal, wherein the pulse signal is powered by the second supply voltage.

9. The memory device as claimed in claim 8, wherein the processing unit comprises:
 a first signal buffering unit coupled between the gate of the common transistor and a first node;
 a pull-down unit coupled between the first node and the ground, wherein the pull-down unit is controlled by the second signal and the third signal; and
 a pull-up unit coupled between the first node and the second supply voltage, wherein the pull-up unit is controlled by the third signal, wherein the first signal buffering unit provides the pulse signal to the gate of the common transistor when the pull-up unit is turned off by the third signal and the pull-down unit is turned on by the second signal and the third signal.

10. The memory device as claimed in claim 9, wherein the pull-down unit comprises:
 a first transistor coupled to the first node, wherein the first transistor is controlled by the second signal; and
 a second transistor coupled between the first transistor and the ground, having a gate for receiving the third signal; and
the pull-up unit comprises:
 a third transistor coupled between the first node and the second supply voltage, having a gate for receiving the third signal.

11. The memory device as claimed in claim 9, wherein the signal buffering unit comprises:
 a first inverter coupled between the first node and the gate of the common transistor, wherein the first inverter is powered by the second supply voltage.

12. The memory device as claimed in claim 11, wherein the signal buffering unit further comprises:
 a fourth transistor coupled between the second supply voltage and the first node, having a gate coupled to an output of the first inverter.

13. The memory device as claimed in claim 9, wherein the level shifter is used to increase an access time and decrease a setup time for the memory array.

14. The memory device as claimed in claim 13, wherein the clock generator further selectively delays the first signal according to a select signal, so as to fine tune the access time and the setup time.

15. The memory device as claimed in claim 8, wherein each of the plurality of dual power rail word line drivers comprises:
 a second signal buffering unit coupled between the word line and a second node;
 a fifth transistor coupled between the second terminal of the common transistor and the second node, wherein the fifth transistor is controlled by the predecode signal; and
 a sixth transistor coupled between the second node and the second supply voltage, having a gate for receiving the pulse signal, wherein the second signal buffering unit provides a word line signal corresponding to the predecode signal to the memory array via the word line.

16. The memory device as claimed in claim 15, wherein each of the plurality of dual power rail word line drivers further comprises:
 a second inverter coupled between a gate of the fifth transistor and the word line decoder, controlling the fifth transistor to turn on or off according to the predecode signal, wherein the second inverter is powered by the first supply voltage.

17. The memory device as claimed in claim 16, wherein the signal buffering unit comprises:
 a seventh transistor coupled between the second supply voltage and the second node, having a gate coupled to the word line; and a third inverter coupled between the second node and the word line, wherein the third inverter is powered by the second supply voltage.

\* \* \* \* \*